United States Patent [19]

Beyer

[11] 4,110,125

[45] Aug. 29, 1978

[54] METHOD FOR FABRICATING SEMICONDUCTOR DEVICES

[75] Inventor: Klaus Dietrich Beyer, Poughkeepsie, N.Y.

[73] Assignee: International Business Machines Corporation, Armonk, N.Y.

[21] Appl. No.: 773,885

[22] Filed: Mar. 3, 1977

[51] Int. Cl.² .................... H01L 21/95; H01L 21/74; H01L 21/76
[52] U.S. Cl. ................................. 148/1.5; 148/187; 156/643; 156/653; 156/657; 156/659; 204/192 E; 204/192 EC; 357/50; 357/54; 427/93; 427/94
[58] Field of Search .............. 156/643, 653, 657, 659, 156/662; 148/1.5, 187; 357/47–50, 54; 204/192 EC, 192 E; 29/576 B, 576 W, 578, 571, 580, 630 R; 427/93–95, 88, 90

[56] References Cited

U.S. PATENT DOCUMENTS 3,917,495  11/1975  Horn .............................. 148/1.5 X

*Primary Examiner*—William A. Powell
*Assistant Examiner*—Thomas Bokan
*Attorney, Agent, or Firm*—Thomas F. Galvin

[57] ABSTRACT

A method for fabricating microminiature, planar semiconductor devices in which the number of defects, in particular, pipes, is minimized. The thicknesses of the thermally grown silicon dioxide and of the silicon nitride masking layers which are used for the formation of limited impurity regions by high temperature diffusion processes within the semiconductor substrate have a specified, limited range. The thickness of the silicon dioxide is between 800Å – 3000Å and the thickness of the silicon nitride is between around 250Å and 600Å, preferably 500Å. The method is particularly useful in forming extremely small emitter regions in bipolar transistors.

22 Claims, 11 Drawing Figures

METHOD FOR FABRICATING SEMICONDUCTOR DEVICES

CROSS REFERENCE TO A RELATED APPLICATION

This application is related to a copending application of Beyer etal, entitled "Semiconductor Fabrication Method for Improved Device Yield," Ser. No. 701,789, U.S. Pat. No. 4,069,068 filed July 2, 1976, and assigned to the same assignee as the present invention.

BACKGROUND OF THE INVENTION

This invention relates to a method of improving the yields of integrated semiconductor circuits by minimizing the number of pipes which result in shorts or leakage between impurity regions of semiconductor devices. More specifically, it relates to the reduction of pipes in impurity regions which are defined by composite silicon dioxide-silicon nitride masking layers during the formation of said regions.

The present aim in semiconductor integrated circuit technology is to achieve higher levels of integration so that tens of thousands of circuits can be fabricated on a semiconductor chip of around 200 mils square. To achieve such levels the individual impurity regions in the semiconductor must be extremely small. For example, semiconductor designers are now fabricating emitter regions in bipolar transistors which are around 0.03 square mils.

Because of this high packing density, as already discussed in the above-referenced, copending application, the presence of micro-defects such as precipitates, dislocations, stacking faults, etc., have a dominating influence on yield, performance and reliability of the semiconductor devices. Such defects are known to cause pipes in the bulk silicon semiconductor material. Said pipes result in shorts between emitter and collector, lower breakdowns, soft junctions, non-uniform doping and many changes of carrier lifetime, of resistivity, etc. These in turn impact transistor parameters such as gain, leakage currents and saturation voltage.

The existence of pipes and their effect is well known to semiconductor designers. There are a number of types, one of which results from the surface micro-defects in the silicon wafer substrate on which is formed the epitaxial layer. These are upwardly extending pipes or dislocation lines. Another type of pipe results from micro-defects in the surface and the body of the epitaxial layer. These are downwardly extending pipes or dislocation lines and are the type principally addressed by the present invention. For example, pipes in NPN transistors appear as N type regions extending from the N emitter region to reach the N collector region through the P type base region. One technique for reducing the number of pipes is disclosed in the above-referenced, copending application by Beyer et al. In that application it is shown that by introducing nucleation sites into those regions of a semiconductor device which are to function as emitters, and subsequently introducing emitter impurities into those regions now having nucleation sites, said sites are converted into small, electrically harmless dislocation loops which minimize the type of pipe formation. The nucleation sites are preferably formed by ion implanting non-doping impurities into the selected regions.

This technique has been successful but it does require extra process steps. It would be much more desirable to reduce or eliminate pipes without the requirement of such added steps.

SUMMARY OF THE INVENTION

Accordingly, it is the primary object of my invention to provide an improved fabrication method to increase the yields of microminiature semiconductor devices.

It is another object of my invention to provide an improved method for minimizing pipes within such devices.

It is a further object of my invention to minimize such pipes without increasing the number of steps involved in making the device.

These and other objects of my invention are achieved by carefully controlling the thickness relationship between the silicon dioxide and silicon nitride composite mask used to define limited impurity regions in the semiconductor device. Specifically, the thickness of the silicon dioxide layer must be between around 800Å and 3000Å; and the thickness of the silicon nitride must be between around 250Å and 600Å, preferably 500Å.

Above around 600, the stress caused by the silicon nitride is too great and results in an unacceptable number of pipes. On the other hand, the nitride layer must be sufficiently thick to provide effective masking properties, viz., around 250Å.

The upper limit of the thickness of the silicon dioxide layer is determined by the process used to etch it. In practice, the oxide thickness must be around 2000Å or less for wet etching. Above this level, extensive undercutting of the oxide layer takes place during the etching process. If plasma (reactive ion) etching is used to etch the masking layer, the silicon dioxide may be as much as 3000Å or thereabouts. The oxide must be thick enough, around 800Å, to act as an effective mask.

My discovery is most advantageously used for extremely small-area impurity regions, such as the emitter regions of transistors which are formed at high temperatures. It had been found by electrical testing and scanning electron microscope analysis done by other semiconductor designers that a large number of pipes in transistors are located at the edge of the emitter window, i.e., where the thermally-grown silicon dioxide layer and the silicon nitride layer defines the emitter region. It is believed that mechanical stresses in the silicon oxide and the nitride layers are the principal contributing factors.

It has also been established that the larger the perimeter-to-area ratio of such regions, the larger is the probability that pipes will cause transistor failures. In other words, the number of pipes at the edge of the emitter as compared to the pipes throughout the emitter is significantly higher for dimensionally smaller emitters. Thus, my method becomes more significant as the impurity regions decrease in surface area, a very desirable feature.

A most important consideration is that the specified composite masking layer is applied prior to the formation of the impurity region. As a result, preferential diffusion caused by pipes is partially eliminated at the edge of the window in said masking layer. After the impurity region is formed, the composite may be removed or left as is, without detrimental effect. In fact, the specified masking layer may even be replaced by another composite nitride-oxide passivation layer of different dimensions or an equivalent passivation layer of other materials. Alternatively, the masking layer may be augmented, as by a second layer of silicon dioxide.

In another embodiment of my invention, the thin oxide-nitride composite is also used to define dielectric isolation regions so as to reduce defect generation at the edges and surface of the isolation regions.

DESCRIPTION OF THE PREFERRED EMBODIMENTS

Referring now to the first preferred embodiment illustrated in FIGS. 1A-1D, a NPN bipolar transistor is formed using an N— substrate 2 as collector, P-type base region 4 and with a composite silicon dioxide/silicon nitride layer being used to selectively form limited N type emitter regions 12. The process steps are conventional, with the exception of the thicknesses of the composite silicon dioxide/silicon nitride masking layer. It will be understood that my invention is also applicable to opposite conductivity type bipolar transistors as well as to other types of devices, although my invention is particularly advantageous in the fabrication of emitter regions within a bipolar transistor.

Figure 1A:
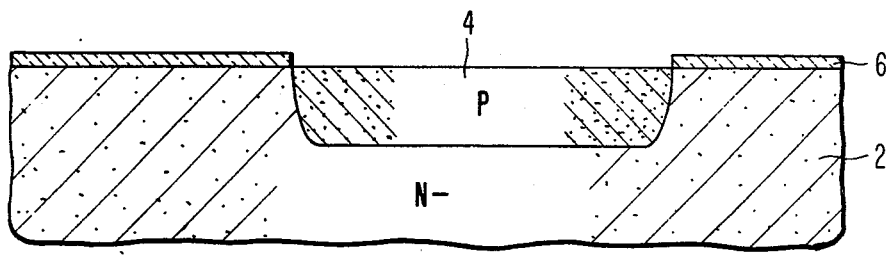
FIGS. 1A-1D show cross-sectional views of one preferred method of fabricating a transistor in accordance with my invention.

Turning now to FIG. 1A, a P type region 4 is formed in an N— substrate 2 having a <100> crystallographic orientation. In this embodiment the P type region is the base of an NPN bipolar transistor, with the N— region 2 serving as the collector.

Region 4 is formed in standard fashion by starting with an oxidized wafer 2, with oxide layer 6 completely covering the wafer and having a thickness of between 1400Å-2000Å, typically 1550Å. Photo-resist is then applied, exposed and developed to define the window into which region 4 is to be diffused. The oxide layer is then etched in buffered HF and the resist is stripped to leave the patterned oxide layer 6. The base is formed by deposition of $BBr_3$ and $O_2$ in an Ar carrier gas to form borosilicate glass over the entire wafer. The boron diffuses into wafer 2 to form P region 4. The borosilicate glass is then stripped away in buffered HF.

Figure 1B:
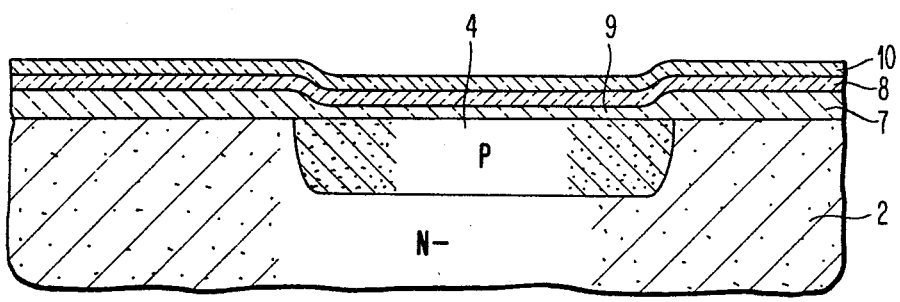

In the next step, the boron is driven-in by a thermal oxidation cycle which results in a silicon dioxide layer 9 which is around 800Å thick and a thicker silicon dioxide layer 7 which is around 2400Å thick as illustrated in FIG. 1B. The boron drive-in and reoxidation cycle to form the 800Å oxide layer 9 typically comprises 10 minutes of dry oxygen at 970° C., followed by 8 minutes of stream and oxygen at 970° C., followed by 25 minutes of dry oxygen at 970° C.

In the next step, a layer of silicon nitride 8 is blanket-deposited over the first silicon dioxide layer. In one standard, prior art process, the silicon nitride deposition is accomplished by flowing a mixture of ammonia, silane and a carrier gas of nitrogen at a temperature of around 1000° C. over the substrate. The process is continued until a thickness of around 1600Å is achieved. As previously noted, however, I have found that this deposition thickness ultimately results in the formation of pipes within the completed device. Therefore, at this step I deposit silicon nitride to a thickness of around 250Å to 600Å only. A thickness of 500Å gives optimum results. This is critical to virtually eliminate the formation of pipes.

Following the deposition of the silicon nitride layer 8, another layer of silicon dioxide layer 10 is deposited pyrolytically atop nitride layer 8. The purpose of oxide layer 10, which is typically around 1000Å thick, is to mask nitride layer 8, because etchants which etch silicon nitride also etch conventional photo-resists. Sputtered silicon dioxide or other well known masks could be substituted for the pyrolytically-deposited $SiO_2$. This completes the structure illustrated in FIG. 1B.

Figure 1C:
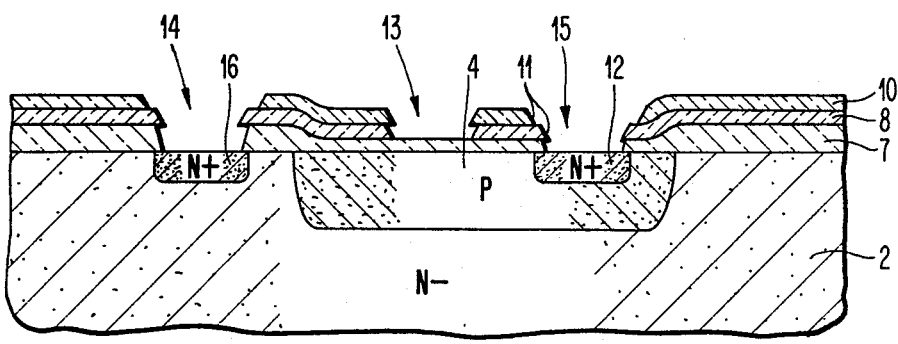
Figure 1D:
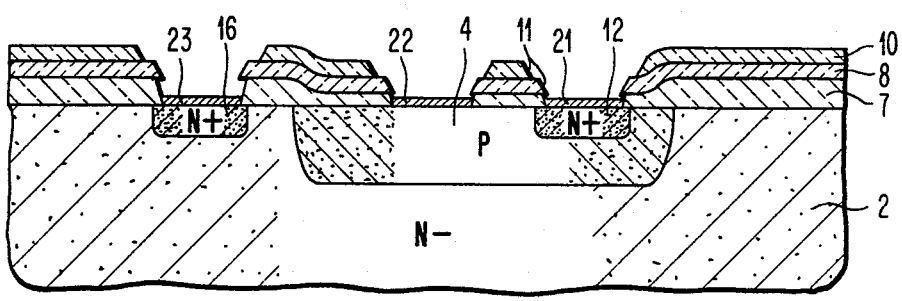

A pattern is then etched in layers 7, 8 and 10 to open areas for the diffusion of N type regions into substrate 2. The formation of the windows shown in FIG. 1C is accomplished by suitable photolithographic and etching techniques. The pyrolytically-deposited $SiO_2$ layer 10 may be etched by a solution of hydrofluoric acid buffered in ammonia fluoride, an etchant which attacks silicon nitride only slowly. Most of the layer 10 is removed in the window at this point. The areas of nitride layer 8 may then be etched in hot phosphoric acid or any other etchant which does not attack silicon dioxide. After the openings have been made in silicon nitride layer 8, the wafer is exposed, at regions where N type impurities are to be diffused, to an etchant which will attack the exposed areas in oxide layer 7. During the etching of windows 14 and 15 in oxide layer 7, the remainder of layer 10 is masked off by photo-resist. In this way, all contact openings 13, 14 and 15 are made in layers 8 and 10, whereas only the N contacts are made in silicon dioxide layer 7.

After the photo-resist is removed, N regions 12 and 16 are diffused into P region 4 and substrate 2, respectively. Region 12 is the emitter region of an NPN transistor and region 16 is the collector contact diffusion. The N type regions are preferably formed by the diffusion of arsenic at a surface concentration of $10^{20}$ atoms/$cm^3$ or more, at 1000° C. which is conventional in the art. A closed capsule diffusion or arsenic doped oxide may be used. Alternatively, the arsenic or other impurity may be ion implanted followed by an annealing step familar to semiconductor process designers.

To form the base contact opening at region 13, photo-resist is applied over the entire substrate and selectively exposed and developed at region 13. That portion of thermal oxide layer 7 in region 13 is then etched to expose the base contact region. Metallic contacts 21, 22 and 23 are then deposited by conventional techniques to form the completed transistor.

Because of the reduced thicknesses of the composite masking layers of silicon nitride/silicon dioxide atop the substrate, there is a danger of an undesirably high capacitance between metallic lands deposited atop composite masking layer 7/8 and substrate 2. This potential problem, if it exists, may be circumvented in at least two ways: layers 7 and 8 may be removed and replaced by thicker layers of the same or equivalent material. Alternatively, pyrolytically deposited layer 10 may be left atop nitride layer 8. The latter technique has the advantage of requiring no added process steps.

A comparison of devices fabricated in accordance with the prior art technique and by my novel technique was made to establish the reduction in pipe density. The emitter region was formed by diffusion of arsenic from a closed capsule source. The results are shown in the following table for two separate sets of wafers, one set of which was formed with standard 6 mil by 5 mil (6 × 5 $mil^2$) emitters and the others formed with extremely small emitters of 0.3 × 0.3 $mil^2$ geometry. Pipe density data was taken from three separate zones of the wafers:

zone 1 represents the area in the center of the wafer; zone 2 is an annulus about the center zone; and zone 3 is the outer annulus of the wafer.

As may be seen from the left-hand side of the table, for wafers having standard 6 × 5 mil² emitter geometries the average pipe density for devices made with the thin, 500Å nitride layer ranges from approximately seven to ten times lower than the average pipe density for the "standard" passivation thickness of 1600Å.

The results are even more startling for emitters of extremely small geometry. As shown in the right-hand side of the table, the pipe density is from around 30 to 100 times better.

The substantially greater pipe density for the smaller emitters, as compared to the larger emitters, with 1600Å of silicon nitride is further evidence that a principal factor in pipe density is the existence of the passivation layer which forms the emitter window.

| Silicon Nitride Thickness | PIPE DENSITY (Number of Pipes Per Mil²) | | | | | |
|---|---|---|---|---|---|---|
| | 6 × 5 Mil² Emitters Wafer Zones | | | 0.3 × 0.3 Mil² Emitters Wafer Zones | | |
| | 1 | 2 | 3 | 1 | 2 | 3 |
| 1600Å | .0034 | .0045 | .0053 | .0365 | .0411 | .0570 |
| 500Å | .0005 | .0004 | .0005 | .0005 | .0012 | .0004 |

FIGS. 2A–2G illustrate a second preferred embodiment of my invention wherein it is extended to both the formation of dielectric isolation regions as well as to the formation of the emitter region of a bipolar transistor. It has been found that stresses also occur during the formation of dielectric isolation regions within a semiconductor substrate, thereby apparently causing pipes which propagate into active device areas during subsequent heat cycles. Therefore, to further reduce the formation of pipes, the same thickness of silicon dioxide and silicon nitride layers as previously discussed is used during the formation of said dielectric isolation regions. As noted with respect to FIGS. 1A–1D, the process steps described in the following figures are not my invention, with the exception of the thicknesses of the composite silicon oxide/silicon nitride masking layer.

Figure 2A:
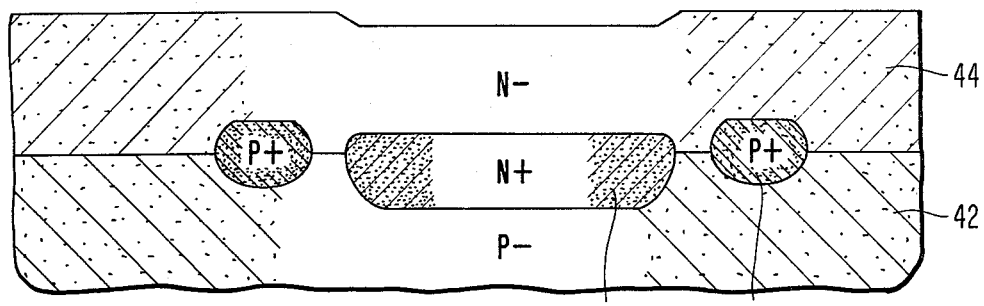
FIGS. 2A-2G show cross-sectional views of another method wherein my invention is used to produce a more sophisticated type of transistor.
Figure 2B:
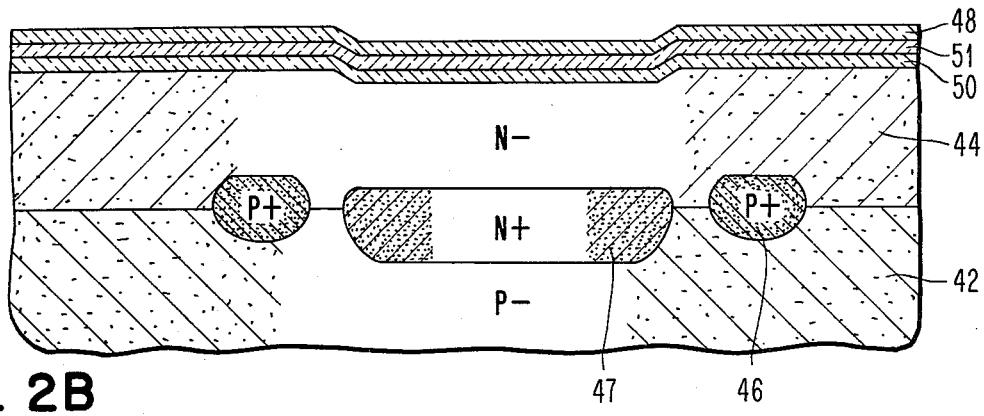

Turning now to FIG. 2A, in a suitable wafer 42 of P− material i.e., a silicon substrate having a resistivity of 10 ohm-cm, N+ region 47 is formed utilizing conventional photolithographic masking techniques. The region may be formed by conventional diffusion of impurities such as phosphorus, arsenic and antimony or the like. The diffusion may be of any open- or closed-tube thermal diffusion technique or ion implantation. Similarly, an annular P+ region 46 is formed for the purpose of isolation. The impurity used is typically boron or gallium having an initial concentration of around $5 \times 10^{19}$ atoms/cm³. Subsequent to the initial diffusion of regions 46 and 47 in substrate 42, an epitaxial layer 44 is formed on substrate 42. Layer 44 generally has a maximum impurity concentration or doping level of $10^{18}$ by conventional epitaxial techniques at a temperature in the order of 950° C. to 1150° C. over a period of 17 minutes. During the formation of epitaxial layer 44, regions 46 and 47 out-diffuse partially up into layer 44. The epitaxial layer has a thickness in the order of from 1 to 4 micrometers, depending on the overall specifications of the integrated circuit.

After the formation of the isolation and subcollector regions, a layer 50 of silicon dioxide is formed by thermally oxidizing the surface of layer 44 to form silicon dioxide having a thickness preferably of 800Å. Next another protective layer 51 of silicon nitride is formed, typically by the pyrolytic technique of the reaction of silane and ammonium or other nitrogen-containing compound as is known in the art. Significantly, the silicon nitride layer 51 is limited to a thickness which is preferably 0.5 micrometers but may range between 0.025 and 0.06 micrometers. Another oxide layer 48 is then pyrolytically deposited over silicon nitride layer 51 typically the deposition is accomplished using silane and carbon dioxide in a hydrogen carrier gas until 0.1 micrometers of oxide is formed.

Figure 2C:
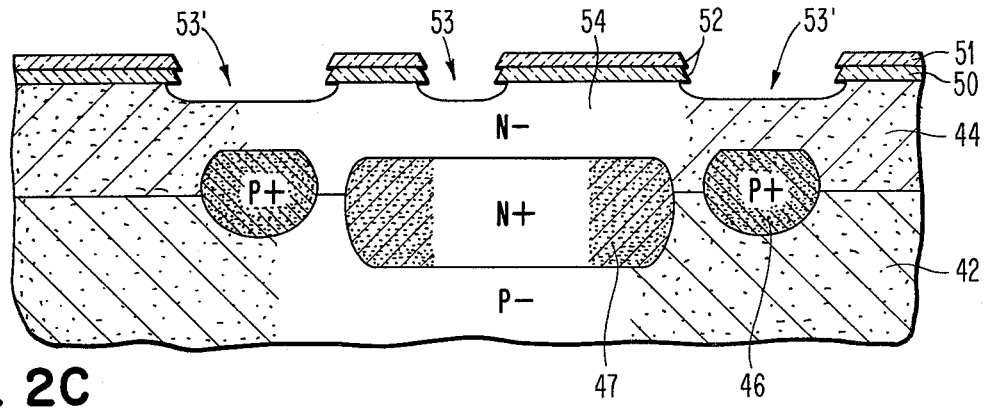

In the next step, as shown in FIG. 2C, an opening 53 and an annular opening 53′ having generally the same circumference as P+ region 46 are etched into epitaxial layer 44.

Windows in masking layers 50 and 51 are formed as previously described with respect to FIG. 1C of this specification. Hence, further description at this point would be redundant. Openings 53 and 53′ are etched in layer 44 using a conventional silicon etchant so as to remove around 4000Å of silicon, assuming that epitaxial layer 44 is around 2.0 micrometers thick. The etching solution is typically 500cc HNO₃ plus 1 gram of iodine, 500cc HNO₃, 50cc acetic acid, 14cc ammonium fluoride, and 2cc of hydrofluoric acid. Different ratios of these ingredients as well as other standard silicon etchants could be used. Region 54 in epitaxial layer 44 is specifically enumerated because it is the area in which the base and emitter of a bipolar transistor are to be formed. This is the region in which the pipes from subcollector 47 and N− epitaxial layer 44 are formed through the base region to the emitter. As previously noted, the recessed oxide isolation process causes stresses in the silicon which tend to generate these pipes. It has been found that the mood limitation of the thickness of silicon nitride layer 51 and silicon oxide layer 50 which are used as masks for the isolation regions results in fewer pipes.

Figure 2D:
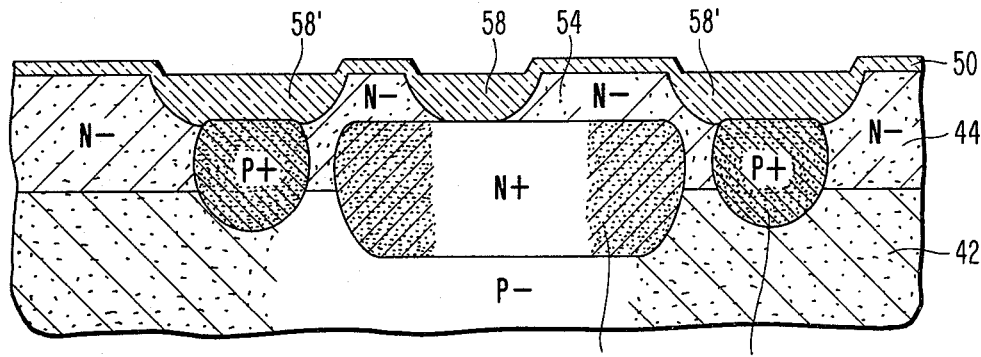

With respect to FIG. 2D, the structure is then put through an oxidation cycle wherein it is placed in an oxidation atmosphere at an elevated temperature in the order of 970° to 1100° C., with or without the addition of water, to produce silicon dioxide regions 58 and 58′. These regions extend substantially from the upper surface of epitaxial layer 44 down to outdiffused regions 46 and 47. The oxidation is continued until regions 58 and 58′ are substantially coplanar with the surface of remaining epitaxial layer 44. As is known in the art, a portion of epitaxial layer 44 is consumed in the oxidation process thereby causing the silicon dioxide regions to extend down to the outdiffused regions.

After the dielectric isolation oxidation process, silicon nitride layer 51 is stripped away with a suitable etchant such as hot phosphoric acid for around 25 minutes to leave only thermally grown oxide layer 50. This leaves a continuous silicon dioxide layer on the substrate which includes thermally grown oxide layer 50 and dielectric isolation regions 58 and 58′.

Figure 2E:
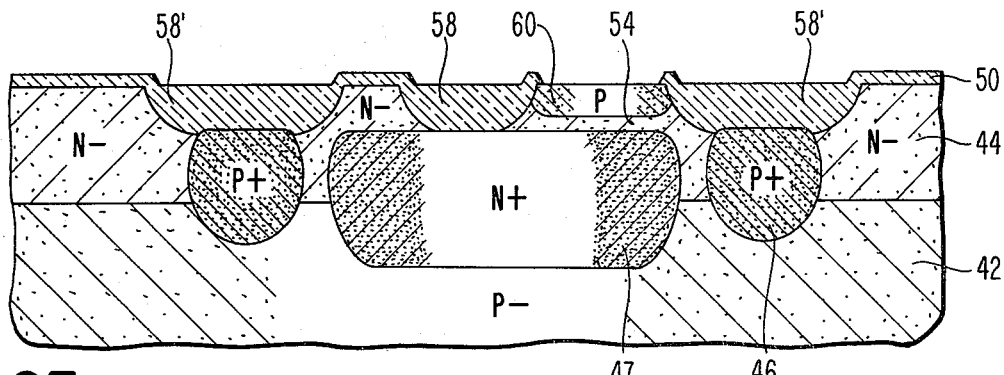

Next the portion of oxide layer 50 atop region 54 is removed and a base region 60 is formed in epitaxial layer 44 as shown in FIG. 2E using conventional photoresist techniques. The base region is typically boron which is formed by diffusing BBr₃, oxygen and an argon carrier gas to form borosilcate glass to a thickness of around 400Å. The borosilicate glass is then stripped in dilute hydrofluoric acid and hot nitric acid. The boron is then driven-in by a reoxidation process using dry oxygen, steam or a combination of both.

Figure 2F:
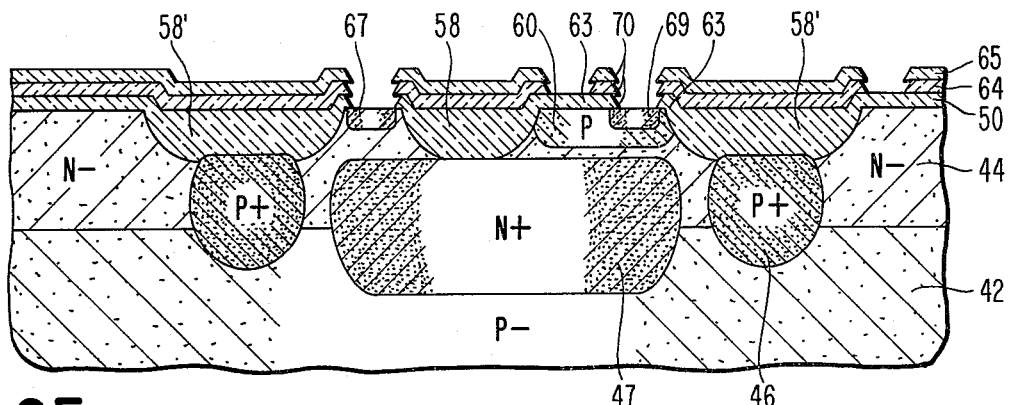
Figure 2G:
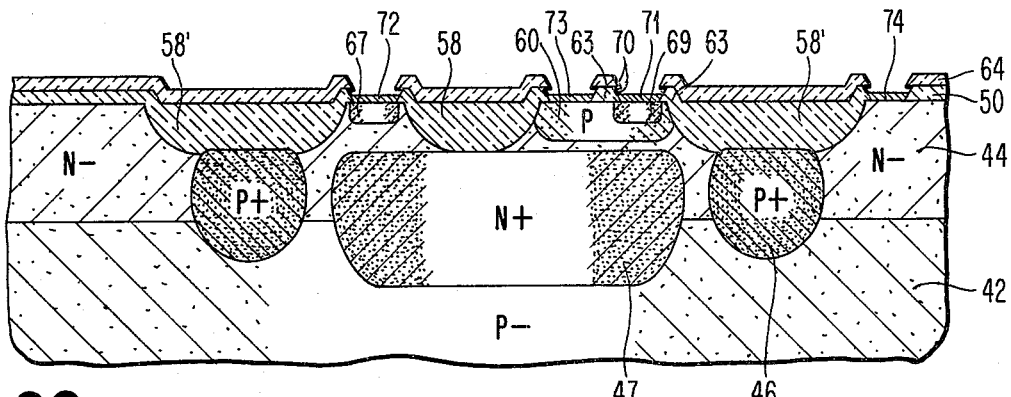

The remainder of the process steps shown in FIGS. 2F and 2G are standard in the art except for the thickness of the silicon nitride and silicon dioxide masking layers. These thicknesses follow the prescription already discussed with regard to FIGS. 1A–1D.

Referring to FIG. 2F, silicon nitride layer 64 is deposited to a thickness of 250–600Å preferably 500Å, followed by the deposition of silicon dioxide layer 65. Openings are made in the masking layers of 50, 64 and 65 to form the emitter regions 69 and a collector contact region 67. The thickness of silicon dioxide layer 50 and silicon nitride layer 64 at region 70 around the emitter window is critical, as previously discussed. The emitter region 69 and the N+ contact region 67 is then formed, preferably by arsenic diffusion or ion implantation.

Using conventional lithographic or reactive etching techniques, openings are then made for the contacts to the base region and Schottky barrier diode region 74. At this step the thermally grown oxide is etched and the pyrolytically deposited oxide layer 65 is stripped. This completes the fabrication process.

The reduction in pipes is verified by comparing the pipe yield of processes using a silicon nitride layer 51 which is 1000Å thick verses one of which is 500Å thin in the fabrication of the recessed oxide isolation regions 58 and 58'. In the former case, the number of pipes per square mil is 0.006 whereas in the latter case the figure is 0.004.

In summary, I have invented a method for reducing pipes at the edges of limited impurity regions of semiconductors, particularly emitters. This is most likely due to a reduction in the stress caused by silicon nitride deposited atop the substrate. Such stress apparently causes the formation of pipes during the subsequent formation of the emitter, either by high temperature diffusion or by ion implantation followed by a high temperature annealing step.

While the invention has been particularly shown and described with reference to a preferred embodiment thereof, it will be understood by those skilled in the art that various changes in form and detail may be made therein without departing from the spirit and scope of the invention.

I claim:

1. In the method of forming a planar, silicon semiconductor device which includes a first region of a first conductivity type, a second region of a second conductivity type formed in said first region and a third region of said first conductivity type formed within said second region, and wherein a composite silicon nitride-silicon dioxide layer is used as a mask during the formation of said third region, the improvement, for reducing the number of pipes extending between said first and third regions, comprising:

forming said silicon dioxide layer on the surface of said semiconductor to a thickness of not more than around 3000Å and not less than around 800Å;

forming said silicon nitride layer atop said silicon oxide layer to a thickness of not more than around 600Å and not less than a thickness of around 250Å so as to provide effective masking properties;

forming a window in said composite layer to define said third region; and forming said third region through said window.

2. A method as in claim 1 wherein said silicon nitride layer is around 500Å thick.

3. A method as in claim 1 wherein said first, second and third regions are the collector, base and emitter regions, respectively, of a bipolar transistor.

4. A method as in claim 3 wherein said emitter region is formed by the diffusion of an appropriate impurity through said opening.

5. A method as in claim 4 wherein said impurity is arsenic.

6. A method as in claim 3 wherein said emitter region is formed by ion implanting an appropriate impurity through said opening.

7. A method as in claim 6 wherein said impurity is arsenic.

8. A method as in claim 1 wherein said window in said composite mask layer is formed by a reactive ion etching process.

9. A method as in claim 1 wherein said openings in said composite mask layer is formed by a wet etching process; and said silicon dioxide layer is not more than around 2000Å thick.

10. In the method of forming a planar, silicon semiconductor transistor which includes a subcollector region of a first conductivity type, disposed partially within both an epitaxial layer as well as a substrate, a base region of a second conductivity type formed above said subcollector, an emitter region of said first conductivity type formed within said base region, and wherein a composite silicon nitride-silicon dioxide layer is used as a mask during the formation of said emitter region, the improvement, for reducing the number of pipes extending between said emitter region and said subcollector region, comprising:

forming said silicon dioxide layer on the surface of said semiconductor to a thickness of not more than around 3000Å and not less than around 800Å;

forming said silicon nitride layer atop said silicon oxide layer to a thickness of not more than around 600Å and not less than a thickness of around 250Å so as to provide effective masking properties;

forming a window in said composite layer to define said emitter region; and forming said emitter region through said window.

11. A method as in claim 10 wherein said silicon nitride layer is around 500Å thick.

12. A method as in claim 10 wherein said emitter region is formed by the diffusion of an appropriate impurity through said opening.

13. A method as in claim 12 wherein said impurity is arsenic.

14. A method as in claim 10 wherein said emitter region is formed by ion implanting an appropriate impurity through said opening.

15. A method as in claim 14 wherein said impurity is arsenic.

16. A method as in claim 10 wherein said window in said composite mask layer is formed by a reactive ion etching process.

17. A method as in claim 10 wherein said window in said composite mask layer is formed by a wet etching process; and said silicon dioxide layer is not more than around 2000Å thick.

18. A method as in claim 10 which further includes the formation of a dielectric isolation region in said epitaxial layer for isolating said emitter and base region from other active regions within said semiconductor and wherein another composite silicon nitride-silicon dioxide layer is used as a mask during the function of said dielectric isolation region, the improvement, for further reducing the number of pipes extending between said emitter region and said subcollector region, comprising:

forming said other silicon dioxide layer on the surface of said semiconductor to a thickness of not more than around 3000Å;

forming said other silicon nitride layer atop said silicon oxide layer to a thickness of not more than around 600Å and not less than a thickness that is sufficient to provide effective masking properties;

forming a window in said other composite layer to define said dielectric isolation region; and forming said dielectric isolation through said window region.

19. A method as in claim 18 wherein said silicon nitride layer is around 250Å thick.

20. A method as in claim 19 wherein said silicon nitride layer is around 500Å thick.

21. A method as in claim 18 wherein said window in said other composite mask layer is formed by a reactive ion etching process.

22. A method as in claim 18 wherein said openings in said composite mask layer is formed by a wet etching process; and said silicon dioxide layer is not more than around 2000Å thick.

* * * * *